(12) United States Patent
Lahner et al.

(10) Patent No.: US 7,412,678 B2
(45) Date of Patent: Aug. 12, 2008

(54) METHOD AND COMPUTER PROGRAM FOR MANAGEMENT OF SYNCHRONOUS AND ASYNCHRONOUS CLOCK DOMAIN CROSSING IN INTEGRATED CIRCUIT DESIGN

(75) Inventors: Juergen Lahner, Sunnyvale, CA (US); Srinivas Adusumalli, San Jose, CA (US); Jonathan Byrn, Kasson, MN (US)

(73) Assignee: LSI Corporation, Milpitas, CA (US)

( * ) Notice: Subject to any disclaimer, the term of this patent is extended or adjusted under 35 U.S.C. 154(b) by 437 days.

(21) Appl. No.: 10/859,874

(22) Filed: Jun. 2, 2004

(65) Prior Publication Data

US 2005/0273741 A1 Dec. 8, 2005

(51) Int. Cl.
*G06F 17/50* (2006.01)
(52) U.S. Cl. .................... 716/6; 716/4; 716/5
(58) Field of Classification Search ........... 716/4–6
See application file for complete search history.

(56) References Cited

U.S. PATENT DOCUMENTS

| | | | | |
|---|---|---|---|---|
| 5,649,176 A * | 7/1997 | Selvidge et al. | ............ | 713/400 |
| 5,650,938 A * | 7/1997 | Bootehsaz et al. | ............ | 716/6 |
| 5,710,910 A * | 1/1998 | Kehl et al. | ............ | 713/400 |
| 6,099,579 A * | 8/2000 | Dowling et al. | ............ | 716/6 |
| 6,173,435 B1 * | 1/2001 | Dupenloup | ............ | 716/18 |
| 6,216,255 B1 * | 4/2001 | Ito et al. | ............ | 716/6 |
| 6,292,930 B1 * | 9/2001 | Agrawal et al. | ............ | 716/16 |
| 6,523,155 B1 * | 2/2003 | Ruedinger | ............ | 716/7 |
| 6,658,635 B1 * | 12/2003 | Tanimoto | ............ | 716/6 |
| 6,762,626 B1 * | 7/2004 | Dreps et al. | ............ | 327/2 |
| 6,785,875 B2 * | 8/2004 | Beerel et al. | ............ | 716/6 |
| 6,980,943 B2 * | 12/2005 | Aitken et al. | ............ | 703/14 |
| 7,007,254 B1 * | 2/2006 | Borkovic et al. | ............ | 716/6 |
| 7,039,887 B2 * | 5/2006 | Khalil et al. | ............ | 716/6 |
| 7,089,443 B2 * | 8/2006 | Albonesi et al. | ............ | 713/501 |
| 2002/0069375 A1 * | 6/2002 | Bowen | ............ | 713/400 |
| 2003/0123588 A1 * | 7/2003 | Parikh | ............ | 375/354 |
| 2004/0073876 A1 * | 4/2004 | Khalil et al. | ............ | 716/6 |
| 2005/0240790 A1 * | 10/2005 | Nadeau-Dostie et al. | .... | 713/400 |
| 2005/0273735 A1 * | 12/2005 | Dargelas | ............ | 716/4 |
| 2006/0190754 A1 * | 8/2006 | Dargelas et al. | ............ | 713/400 |

\* cited by examiner

*Primary Examiner*—Jack Chiang
*Assistant Examiner*—Naum B Levin
(74) *Attorney, Agent, or Firm*—Eric James Whitesell

(57) ABSTRACT

A method and computer program are disclosed for managing synchronous and asynchronous clock domain crossings that include steps of: (a) receiving as input an integrated circuit design; (b) identifying paths between synchronous clock domains and paths between asynchronous clock domains in the integrated circuit design; and (c) if a path between synchronous clock domains is defined as a false path in the integrated circuit design, then reporting a fatal violation.

16 Claims, 3 Drawing Sheets

US 7,412,678 B2

METHOD AND COMPUTER PROGRAM FOR MANAGEMENT OF SYNCHRONOUS AND ASYNCHRONOUS CLOCK DOMAIN CROSSING IN INTEGRATED CIRCUIT DESIGN

BACKGROUND OF THE INVENTION

1. Field of the Invention

The present invention is directed to integrated circuit design software used in the manufacture of integrated circuits. More specifically, but without limitation thereto, the present invention is directed to managing data path crossings between synchronous and asynchronous clock domains in integrated circuit design.

2. Description of the Prior Art

Current methods for synchronizing data path crossings between asynchronous clock domains in an integrated circuit design generally require that a designer manually generate false path timing constraints or add synchronizers to a data path in the RTL code. A false path is a term used in static timing analysis (STA) that indicates that the timing from a certain start point to a certain end point in a path is not valid (false) and therefore is not required to satisfy timing closure. For example, a path is false if it is not possible to generate a timing violation on the path due to the logic associated with the path.

SUMMARY OF THE INVENTION

In one embodiment of the present invention, a method includes steps of:
 (a) receiving as input an integrated circuit design;
 (b) identifying paths between synchronous clock domains and paths between asynchronous clock domains in the integrated circuit design; and
 (c) if a path between synchronous clock domains is defined as a false path in the integrated circuit design, then reporting a fatal violation.

In another aspect of the present invention, a computer program product for managing synchronous and asynchronous clock domain crossings includes a medium for embodying a computer program for input to a computer and a computer program embodied in the medium for causing the computer to perform steps of:
 (a) receiving as input an integrated circuit design;
 (b) identifying paths between synchronous clock domains and paths between asynchronous clock domains in the integrated circuit design; and
 (c) if a path between synchronous clock domains is defined as a false path in the integrated circuit design, then reporting a fatal violation.

DESCRIPTION OF THE DRAWINGS

The present invention is illustrated by way of example and not limitation in the accompanying figures, in which like references indicate similar elements throughout the several views of the drawings, and in which.

DESCRIPTION OF THE ILLUSTRATED EMBODIMENTS

Figure 1A:
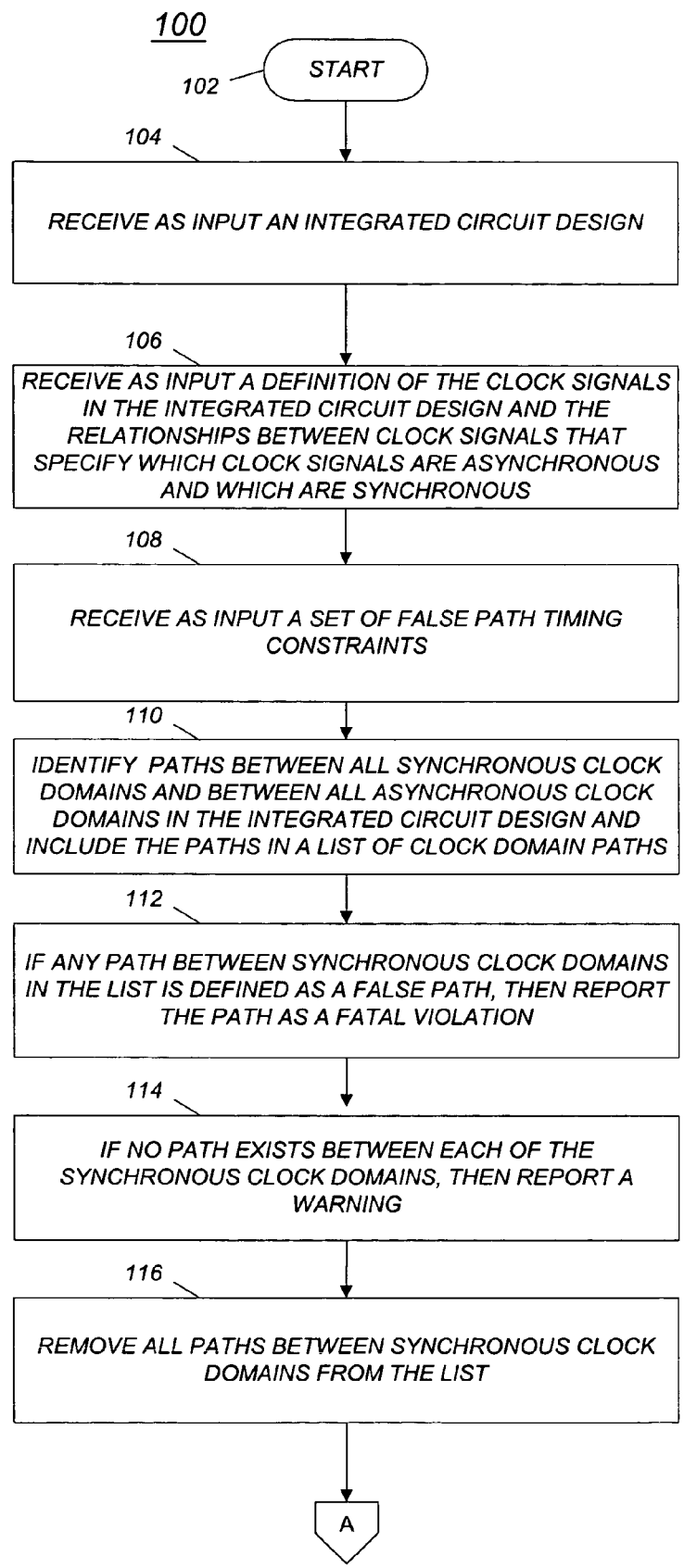
FIGS. 1A and 1B illustrate a flow chart of a method of reporting violations if data paths between synchronous clock domains are defined as false paths according to an embodiment of the present invention.

Synchronization of valid data paths between asynchronous clock domains is important to avoid meta-stabilities that may result in malfunction of the integrated circuit. Because the arrival time of data at the flip-flop in the destination clock domain is unknown, the data must be registered, that is, synchronized, either by adding an additional flip-flop or accompanying the data signal with a data valid, or handshake signal. Both of these devices are referred to as synchronizers.

A disadvantage of previous methods for synchronizing data paths in integrated circuits is that manually defined false path timing constraints and data path synchronizers are often added to integrated circuit designs by circuit design engineers who are unfamiliar with the original circuit design or by circuit designers who are familiar with the logical ramifications but not the effects on static timing analysis. As a result, the final silicon may not function properly due to incomplete or incorrect false timing constraint definitions and omitted data path synchronizers.

Timing analysis and closure is an essential element in the design of an integrated circuit. If a critical path is mistakenly identified as a false path, the critical path may be excluded from the timing analysis and therefore not corrected before the final silicon is patterned. Also, once a data path is incorrectly identified as a false path, there exists no effective mechanism in the timing analysis to indicate that the incorrect identification has occurred. More often than not, the results of the timing analysis appear to have improved, which increases the likelihood of failure in the final silicon.

On the other hand, if a false path in an integrated circuit design is not properly identified as such, a timing closure tool would attempt to perform timing closure on the false path. Integrated circuit design optimization tools typically include heuristics that govern how much effort may be expended to optimize the problem space. Accordingly, it is important that the problem space be narrowed to the minimum required to produce the best results. For example, if the optimization tool is applied to a path that is not needed, there may not be enough time allowed by the heuristics to check a path for which a successful timing closure may be made. In addition, attempting to solve a non-existent problem consumes valuable chip resources such as chip area and wire traces. As a minimum, valuable circuit designer and computer time is expended unnecessarily in attempting to resolve timing violations for false paths that are not correctly identified.

A timing error may also occur even when the timing analysis appears to be closed. This may occur, for example, when two intersecting clock domains are assumed to be synchronous but in fact cannot actually be synchronous. This is typically the case when the two intersecting clock domains originate from different clock signal sources. Unless there is a higher level of clock synchronization then the "start times" for the clock signal sources cannot be guaranteed to have any relationship, therefore there is no defined relationship between the clock signals. However, existing static timing analysis tools do not generally provide for separately starting the clock signal source for each of the clock domains, which may lead to a false timing closure. In addition, unless a technique is applied in simulation that addresses the different start times, then the simulation may also appear to be valid. The method of managing synchronous and asynchronous data paths between clock domains of the present invention advantageously avoids the problems described above.

Because false path timing constraints are generated manually and often require updating, timing closure becomes inefficient and error prone. For example, false paths may be determined by trial and error, that is, by performing a timing analysis, detecting a timing violation, and discussing the timing violation with the circuit designer to determine whether the timing violation is a true timing violation or a false path. While the determination may be valid at the time, subsequent changes to the circuit design may render the determination invalid. Keeping track of false path identifications may be practical for a small number of timing violations in timing closure, but becomes unmanageable when hundreds, thousands, or hundreds of thousands of paths have to be verified.

Another disadvantage of previous methods for synchronizing data paths in integrated circuits is that there exists no automated insertion of data synchronizers for valid data paths between asynchronous clock domains.

Some important features of the present invention are that false paths not relevant to timing closure may be properly identified and that asynchronous clock domain crossings may be verified within an automated design flow, advantageously increasing efficiency of integrated circuit design and reducing manufacturing costs.

In one embodiment of the present invention, a method includes steps of:
  (a) receiving as input an integrated circuit design;
  (b) identifying paths between synchronous clock domains and paths between asynchronous clock domains in the integrated circuit design; and
  (c) if a path between synchronous clock domains is defined as a false path in the integrated circuit design, then reporting a fatal violation.

Figure 1B:
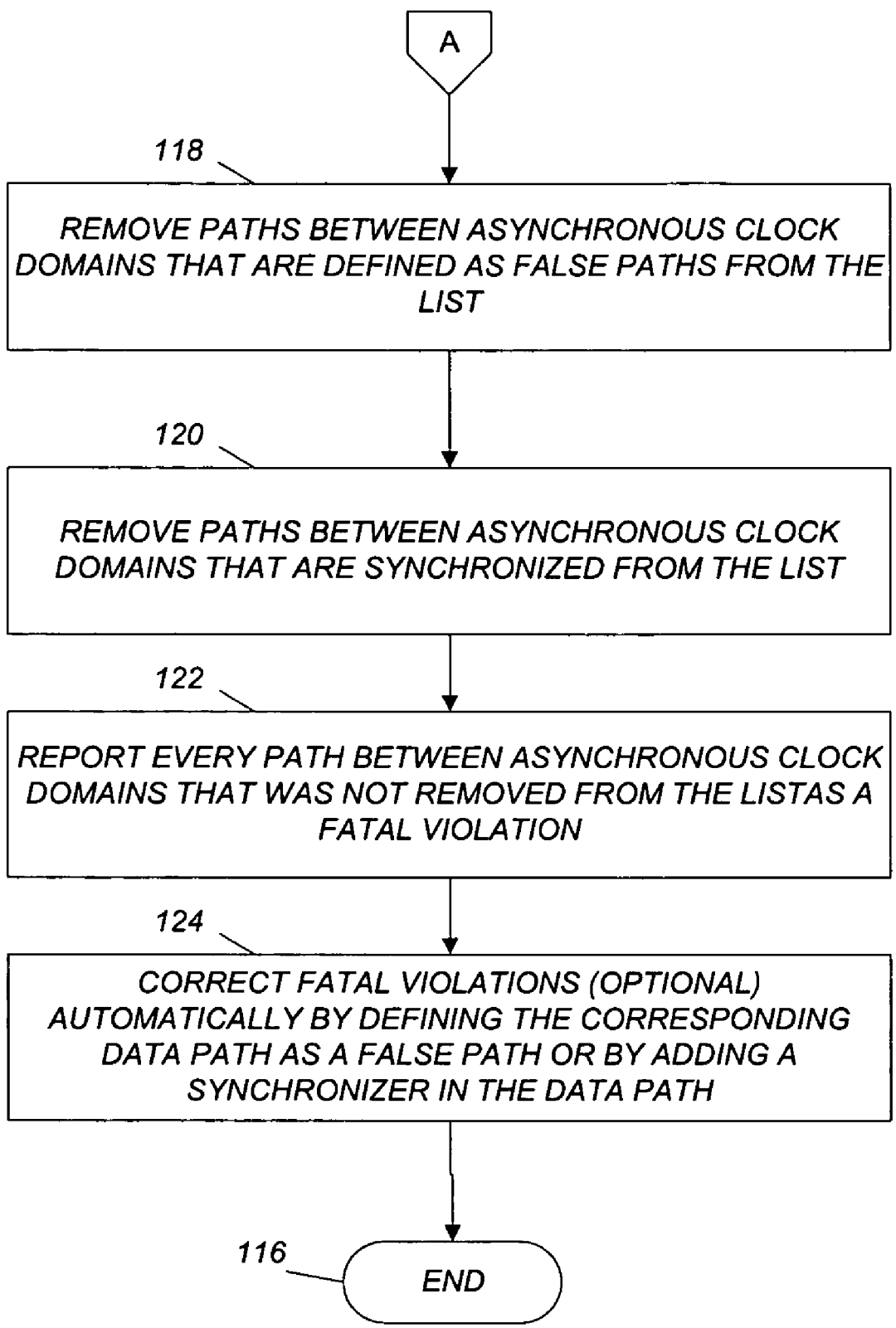

FIGS. 1A and 1B illustrate a flow chart 100 of a method of reporting violations if data paths between synchronous clock domains are defined as false paths according to an embodiment of the present invention.

Step 102 is the entry point of the flow chart 100.

In step 104, an integrated circuit design is received as input. The integrated circuit design may be, for example, a netlist or the register transfer level (RTL) code of the integrated circuit design.

In step 106, a definition of the clock signals in the integrated circuit design and the relationships between the clock signals that specify which clock signals are asynchronous and which are synchronous is received as input. The definition and relationships of the clock signals may be, for example, defined by the user in a clock definition file. Synchronous clock signals are clock signals that are (1) explicitly defined to be synchronously related, for example, by a clock definition file; or (2) originate from a common clock signal source; or (3) originate from separate clock signal sources that have been synchronized to each other, for example, two phase locked loops chained together.

In step 108, a set of false path timing constraints is received as input, for example, as a design constraints file. A design constraints file typically includes commands such as "set_false_path <start point> to <end point>" to define a false path for commercially available static timing analysis software tools.

In step 110, paths between all synchronous clock domains and paths between all asynchronous clock domains are identified from the integrated circuit design according to well known programming techniques and included in a list of clock domain paths, for example, with standard design tools according to well-known techniques. A clock domain is a set of circuit elements each driven by the same clock signal.

In step 112, if any path between synchronous clock domains in the list is defined as a false path, then a fatal violation is reported, because no path between synchronous clock domains may be a false path, except in certain cases in which a path between synchronous clock domains is never used. Paths that are never used may be dealt with appropriately on an individual basis. A fatal violation must be corrected before tape-out of the integrated circuit design to avoid a possible malfunction of the final product.

In step 114, if no path exists between each of the synchronous clock domains, then a warning is reported before transferring control to step 116. The warning may alert the circuit designer to investigate why clock domains that are not connected are designated as synchronous clock domains.

In step 116, all paths between synchronous clock domains are determined to be valid, and these paths are removed from the list, so that only paths between asynchronous clock domains remain on the list.

In step 118, paths between asynchronous clock domains that are defined in the integrated circuit design as false paths are removed from the list.

In step 120, paths between asynchronous clock domains that are synchronized, for example, by clock synchronization circuits, are removed from the list.

In step 122, every path between asynchronous clock domains that was not removed from the list is reported as a fatal violation. Because these paths are not defined as false paths and are not synchronized, a meta-stable state of the data path may result in malfunction of the integrated circuit.

In step 124, a fatal violation may be corrected automatically by defining the corresponding data path as a false path or by adding a synchronizer in the data path. A data path may be synchronized, for example, by inserting a flip-flop in the data path between the clock domains and driving the flip-flop by the same clock signal that drives the destination clock domain or by adding a data valid or handshake signal according to well-known techniques.

Step 126 is the exit point of the flow chart 100.

In another embodiment of the present invention, a computer program product for managing synchronous and asynchronous clock domain crossings in an integrated circuit design includes a medium for embodying a computer program for input to a computer and a computer program embodied in the medium for causing the computer to perform the following steps:
  (a) receiving as input an integrated circuit design;
  (b) identifying paths between synchronous clock domains and paths between asynchronous clock domains in the integrated circuit design; and
  (c) if a path between synchronous clock domains is defined as a false path in the integrated circuit design, then reporting a fatal violation.

Figure 2:
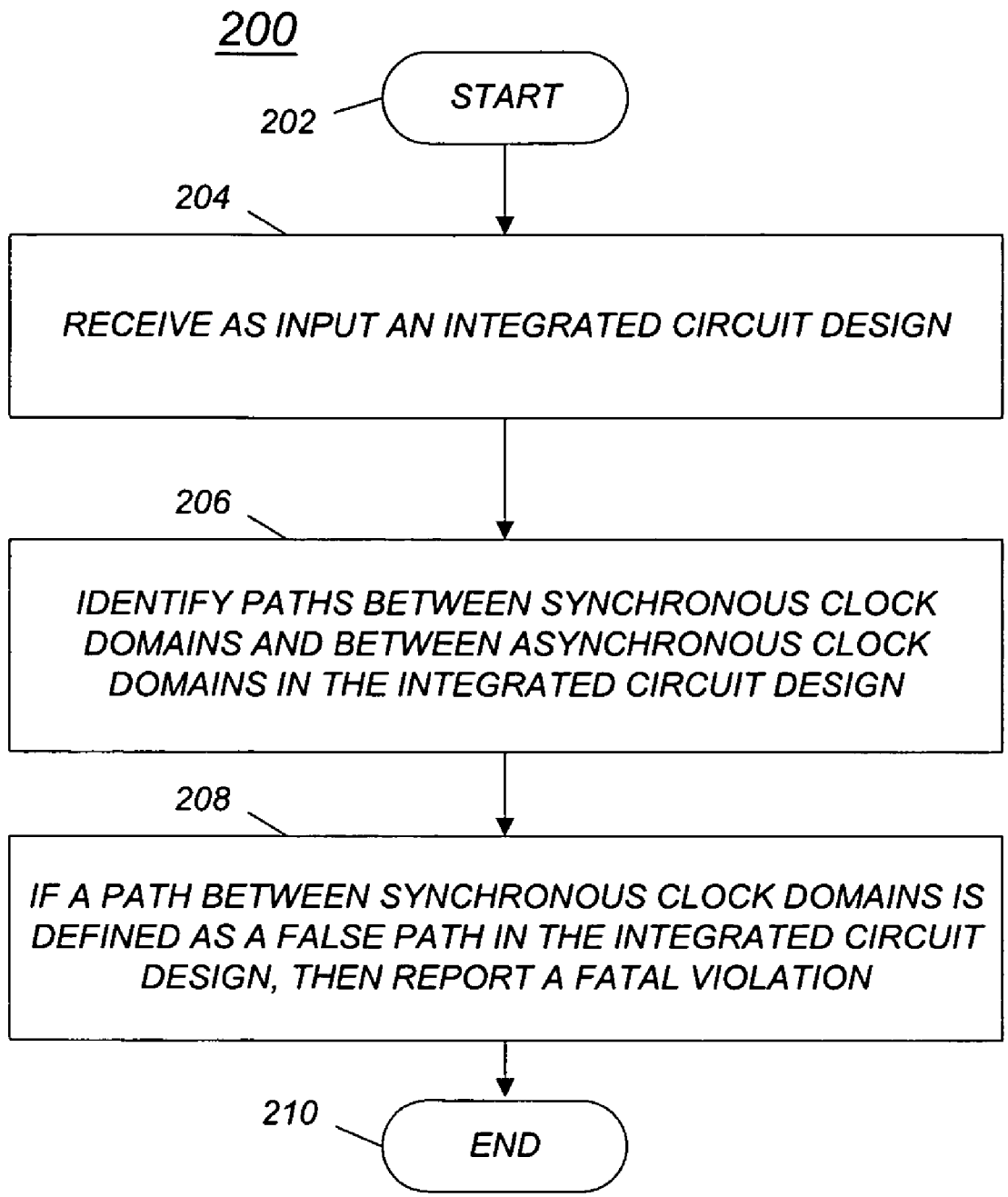
FIG. 2 illustrates a flow chart summarizing the method described for FIGS. 1A and 1B according to an embodiment of the present invention.

FIG. 2 illustrates a flow chart 200 summarizing the method described for FIGS. 1A and 1B according to an embodiment of the present invention.

Step 202 is the entry point of the flow chart 200.

In step 204, an integrated circuit design is received as input. The integrated circuit design may be, for example, a netlist or register transfer level (RTL) code.

In step 206, paths between all synchronous clock domains and paths between all asynchronous clock domains in the integrated circuit design are identified in the integrated circuit design.

In step 208, if a path between synchronous clock domains is defined in the integrated circuit design as a false path, then a fatal violation is reported.

Step 210 is the exit point of the flow chart 200.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:
   receiving as input an integrated circuit design;
   receiving as input a set of false path timing constraints to define false paths in the integrated circuit design;
   identifying paths in the integrated circuit design that exist between one synchronous clock domain and another synchronous clock domain and paths in the integrated circuit design that exist between one asynchronous clock domain and another asynchronous clock domain; and
   reporting a fatal violation when a path between synchronous clock domains is defined as a false path in the integrated circuit design.

2. The method of claim 1 further comprising a step of reporting a warning when no path exists between synchronous clock domains.

3. The method of claim 2 further comprising a step of reporting a path that exists between asynchronous clock domains as a false path.

4. The method of claim 2 further comprising a step of reporting a path that exists between asynchronous clock domains and is not reported as a false path and is not synchronized as a fatal violation.

5. The method of claim 4 further comprising a step of synchronizing the path between asynchronous clock domains that is not reported as a false path and is not synchronized.

6. The method of claim 4 further comprising a step of defining the path between asynchronous clock domains that is not reported as a false path and is not synchronized as a false path.

7. The method of claim 1, the integrated circuit design comprising a netlist.

8. The method of claim 1, the integrated circuit design comprising register transfer level code.

9. A computer readable storage medium tangibly embodying program instructions that when executed by a computer implement a method of managing synchronous and asynchronous clock domain crossings, the method comprising steps of:
   receiving as input an integrated circuit design;
   receiving as input a set of false path timing constraints to define false paths in the integrated circuit design;
   identifying paths in the integrated circuit design that exist between one synchronous clock domain and another synchronous clock domain and paths in the integrated circuit design that exist between one asynchronous clock domain and another asynchronous clock domain; and
   reporting a fatal violation when a path between synchronous clock domains is defined as a false path in the integrated circuit design.

10. The computer readable storage medium of claim 9 further comprising a step of reporting a warning when no path exists between synchronous clock domains.

11. The computer readable storage medium of claim 10 further comprising a step of reporting a path that exists between asynchronous clock domains as a false path.

12. The computer readable storage medium of claim 10 further comprising a step of reporting a path that exists between asynchronous clock domains and is not reported as a false path and is not synchronized as a fatal violation.

13. The computer readable storage medium of claim 12 further comprising a step of synchronizing the path between asynchronous clock domains that is not reported as a false path and is not synchronized.

14. The computer readable storage medium of claim 12 further comprising a step of defining the path between asynchronous clock domains that is not reported as a false path and is not synchronized as a false path.

15. The computer readable storage medium of claim 9, the integrated circuit design comprising a netlist.

16. The computer readable storage medium of claim 9, the integrated circuit design comprising register transfer level code.

* * * * *